(12) United States Patent
Oehlbeck et al.

(10) Patent No.: US 7,369,268 B2
(45) Date of Patent: May 6, 2008

(54) LIGHT SOURCE USING LARGE AREA LEDS

(75) Inventors: Martin E. Oehlbeck, Rochester, NY (US); Richard L. Druzynski, East Rochester, NY (US); Robert J. Zolla, Rochester, NY (US); James E. Roddy, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 1103 days.

(21) Appl. No.: 10/342,009

(22) Filed: Jan. 14, 2003

(65) Prior Publication Data
US 2004/0135874 A1    Jul. 15, 2004

(51) Int. Cl.
*G06F 15/00* (2006.01)
*G06K 1/00* (2006.01)

(52) U.S. Cl. .................. 358/1.4; 358/1.7; 358/1.18; 347/232; 347/238; 347/241; 347/256

(58) Field of Classification Search ............... 355/41; 347/238, 239, 232, 241, 247; 399/49; 430/58.25; 358/1.15, 1.13, 509, 1.14, 481, 1.4, 1.7, 1.18, 358/502, 503; 372/38.1; 359/196
See application file for complete search history.

(56) References Cited

U.S. PATENT DOCUMENTS

| | | | |
|---|---|---|---|
| 4,728,965 A | 3/1988 | Kessler et al. | |
| 4,760,407 A * | 7/1988 | Arimoto et al. | ............ 347/241 |
| 5,061,049 A | 10/1991 | Hornbeck | |
| 5,325,137 A | 6/1994 | Konno et al. | |
| 5,461,411 A | 10/1995 | Florence et al. | |
| 5,521,748 A | 5/1996 | Sarraf | |
| 5,652,661 A | 7/1997 | Gallipeau et al. | |
| 5,701,185 A | 12/1997 | Reiss et al. | |
| 5,743,610 A | 4/1998 | Yajima et al. | |
| 5,743,612 A | 4/1998 | Matsuda et al. | |
| 5,745,156 A | 4/1998 | Federico et al. | |
| 5,805,274 A | 9/1998 | Saita | |
| 5,808,800 A | 9/1998 | Handschy et al. | |
| 6,133,933 A * | 10/2000 | Paoli | ........................... 347/238 |
| 6,205,161 B1 * | 3/2001 | Kappeler | ................... 372/38.1 |
| 6,215,547 B1 | 4/2001 | Ramanujan et al. | |
| 6,227,669 B1 | 5/2001 | Tiao et al. | |
| 6,330,018 B1 * | 12/2001 | Ramanujan et al. | ........ 347/239 |
| 6,396,565 B1 * | 5/2002 | Yamamoto et al. | ........... 355/41 |
| 6,414,705 B1 * | 7/2002 | Yamada et al. | ............. 347/232 |

(Continued)

FOREIGN PATENT DOCUMENTS

DE    197 28 354    7/1999

(Continued)

*Primary Examiner*—Thomas D. Lee
*Assistant Examiner*—Satwant Singh
(74) *Attorney, Agent, or Firm*—Nelson Adrian Blish

(57) ABSTRACT

A printing apparatus (100) for printing digital images onto a photosensitive medium (140) employing, for exposure energy, a light source (20) that uses various arrays of LEDs (32). The printing apparatus (100) may form the print image using sequential modulation, one color at a time, or by applying all colors simultaneously. Arrangements of discrete LEDs (32) may include high-intensity devices configured with collector cones (41) arranged as a multicone structure (141), with parabolic reflectors (65), or collimating lenses (36). Large area LEDs (46) may alternately be used, arranged on an angled mounting surface (64), for example.

8 Claims, 15 Drawing Sheets

U.S. PATENT DOCUMENTS

| | | | |
|---|---|---|---|
| 6,418,281 B1* | 7/2002 | Ohki | 399/49 |
| 6,724,413 B2* | 4/2004 | Ng | 347/238 |
| 6,760,055 B2* | 7/2004 | Toki et al. | 347/247 |
| 6,850,348 B2* | 2/2005 | Morita | 359/196 |
| 6,900,825 B2* | 5/2005 | Kito | 347/239 |
| 6,975,344 B2* | 12/2005 | Okazaki | 347/238 |
| 7,070,892 B2* | 7/2006 | Bender et al. | 430/58.25 |
| 7,158,269 B2* | 1/2007 | Morita | 358/481 |
| 2002/0033988 A1* | 3/2002 | Morita et al. | 359/196 |
| 2002/0097474 A1* | 7/2002 | Morita | 359/196 |
| 2004/0165236 A1* | 8/2004 | Morita | 359/196 |

FOREIGN PATENT DOCUMENTS

| | | |
|---|---|---|
| EP | 1176803 | 1/2002 |
| GB | 2282700 | 4/1995 |
| JP | 11-282092 | 10/1999 |
| WO | 02/06865 | 1/2002 |

* cited by examiner

1 IN. SQUARE SOURCE AREA

LIGHT SOURCE USING LARGE AREA LEDS

CROSS REFERENCE TO RELATED APPLICATIONS

Reference is made to commonly-assigned copending U.S. patent application Ser. No. 09/794,669, filed Feb. 27, 2001, entitled METHOD AND APPARATUS FOR PRINTING HIGH RESOLUTION IMAGES USING MULTIPLE REFLECTIVE SPATIAL LIGHT MODULATORS, by Ramanujan et al., and U.S. application Ser. No. 09/976,171, filed Oct. 12, 2001, entitled A TWO LEVEL IMAGE WRITER, by Roddy, et al., the disclosures of which are incorporated herein.

FIELD OF THE INVENTION

The apparatus and method of the present invention generally relate to writers for forming an image from digital data onto a photosensitive medium and more particularly relate to an improved light source employing LEDs for recording an image onto a photosensitive medium.

BACKGROUND OF THE INVENTION

With the advent of digital imaging, a number of different writing technologies have been employed for imaging onto photosensitive media such as photographic paper and motion picture film. Early printers adapted cathode ray tubes (CRTs) for providing exposure energy onto the photosensitive medium. In a CRT-based printer, the digital image data is used to modulate the CRT, providing exposure energy by scanning an electron beam of variable intensity along a phosphorescent screen. While CRT-based imaging provided a suitable solution for some imaging applications, high cost and relatively slow speeds, as well as constraints on resolution and contrast limit the usefulness of this approach.

Alternative writers employ lasers, such as the laser-based writing engine disclosed in U.S. Pat. No. 4,728,965. With this type of imaging, red, green, and blue lasers provide the exposure energy. Digital data is used to modulate laser intensity as the beam is scanned by a rotating polygon onto the imaging plane. Unfortunately, as with CRT printers, laser based systems tend to be expensive, particularly since the cost of blue and green lasers remains high. Additionally, compact lasers having sufficiently low noise levels and the stable output behavior necessary for accurate reproduction of an image without unwanted artifacts are not widely available. While lasers provide advantages for high-power applications, they are not well suited to the reciprocity characteristics of conventional photographic film and paper media. Thus, special media is often required for imaging using laser exposure energy.

The speed, cost, and performance problems of existing digital imaging systems limit the utility of such systems with some types of photosensitive media. These problems are particularly pronounced for high speed raster printing applications, such as those needed when printing motion picture film. CRT printers, for example, require exposure durations lasting as long as a few minutes per frame. Commercially available raster laser print systems are faster, but still require 3-10 seconds per frame. For digital mastering of a full length feature film to be commercially feasible, however, print speeds of at least two frames per second are required. Writing film at real-time speeds would require significantly better throughput, at approximately 24-30 frames per second. As the figures given here indicate, this 24-30 frames per second speed appears to be out of reach of conventional CRT and laser technologies using raster imaging methods.

Two-dimensional spatial light modulators, while originally developed for projectors and displays, also show promise for writing applications. Unlike the slower, raster-scanned energy sources of CRT and laser-polygon devices, spatial light modulators provide exposure energy for a complete image frame at a time. Essentially a two-dimensional array of light-valve elements, with each element corresponding to a pixel, the spatial light modulator operates by selectively reflecting or changing the polarization state of each image pixel. Standard types of spatial light modulators include digital micromirror devices (DMDs) and liquid crystal devices (LCDs).

DMD solutions, such as that shown in U.S. Pat. No. 5,461,411 offer advantages such as longer exposure times compared to laser/polygon writers. This helps to alleviate reciprocity problems associated with photosensitive media during short periods of light exposure. However, DMD technology is expensive and is not widely available. Furthermore, DMDs are not currently available at high enough resolutions for printer applications and are not easily scaleable to higher resolution.

The LCD type of spatial light modulator modulates by selectively altering the polarization state of each image pixel. Types of LCD include transmissive and reflective. Both types of device have been used in imaging systems. For example, U.S. Pat. Nos. 5,652,661 and 5,701,185 disclose printing apparatus that form images using transmissive LCDs. However, there are several drawbacks to the use of conventional transmissive LCD technology. Because of the space required for circuit traces and components, transmissive LCD modulators generally have reduced aperture ratios. Transmissive field-effect-transistors (TFT)-on-glass technology does not provide sufficient pixel to pixel uniformity needed for many printing and film recording applications. Furthermore, the large footprints of transmissive LCD devices, needed in order to provide large numbers of pixels for improved resolution, prove to be unwieldy as part of an optical system designed for printing or film recording applications. As a result, most LCD printers using transmissive technology are constrained to either low resolution or small print sizes.

In contrast, reflective LCD modulators provide superior performance and significantly reduce the cost of the printing system. Exposure times for individual pixels shift from tens of nanoseconds to tens of milliseconds, a million-fold increase. This increased exposure time, along with an increased aperture size for each pixel, allows a modest increase in writer throughput to two frames per second or better, without the media reciprocity problems otherwise caused by short exposure times.

Both transmissive and reflective types of LCDs present limitations. However, particularly with reflective LCDs, device performance continues to improve, making it advantageous to employ reflective LCDs in printer applications.

LCDs can modulate light from any of a number of sources. Conventional printers employ lamps as light sources. However, although lamps can provide output power levels sufficient for high speed printing, they do have some inherent limitations, such as high levels of heat and IR generation. Additionally, lamps cannot be switched on and off at rates sufficient for high speed print applications. For reasons cited above, lasers continue to be less desirable for writing to photosensitive media. In addition, laser sources exhibit undesirable coherent light effects, such as speckle.

Light emitting diodes (LEDs) have been used, with some degree of success, in printers, however, there is considerable room for improvement.

It is well recognized in the imaging arts that LEDs are not designed with writing applications in mind. Conventionally manufactured for use in display applications with visible light, LEDs are designed to provide modest levels of brightness with high angular divergence. Since they are characterized primarily for display functions, LEDs are specified by manufacturers for brightness and other photometric characteristics that relate to human eye response. Photometric ratings of LED light sources, usually given in lumens or candelas, give very little useful information related to suitability for film exposure.

It is the radiometric, rather than photometric, characteristics of the light source that are of most interest when writing onto photosensitive media. Writing wavelengths, for example, need not be in the visible range; there can be advantages in using light with very short, near-ultraviolet wavelengths or in longer infrared wavelengths. Writing speed, for example, is a function of radiance (typically expressed in watts per square centimeter-steradian), rather than of brightness. The high angular divergence of light from LEDs, beneficial for display purposes, is detrimental for writing purposes, where a narrow emission angle and small emission area works best for achieving high resolution and high speed. Specifications of dominant wavelength, conventionally provided for high-brightness display LEDs, can be misleading from the perspective of characteristics needed for writing to photosensitive media. The actual peak emission wavelength can vary substantially from the dominant wavelength that is perceived by the human eye.

Photosensitive Media Characteristics

As is described above, LEDs are largely designed for visibility to the human eye, for use in a variety of display applications. Design for display visibility, however, often conflicts with requirements for exposure of photosensitive media. Referring to FIG. 3, there is shown a representative graph of spectral sensitivity versus wavelength per color layer for a type of color internegative film used in motion picture printing. The vertical scale is a log scale. Thus, a 0 value corresponds to an exposure level of 1 erg/cm$^2$; a value of 1 corresponds to an exposure level of 0.1 erg/cm$^2$; a value of −1 corresponds to an exposure level of 10 erg/cm$^2$. For comparison, overlaid onto graphs for spectral sensitivity of this photosensitive medium is a normalized curve showing the photopic response of the human eye. As the graph of FIG. 3 indicates, there can be substantial differences between the response of a photosensitive medium over a range of wavelengths and the response of the human eye. Certainly, the human eye has a heightened response to subtle changes of color intensity and hue in some parts of the spectrum. Film sensitivity, however, is much more pronounced for different exposure wavelengths. As shown in FIG. 3, for example, sensitivity for the red layer is roughly 1/100 that of the blue layer.

The color response characteristics of photosensitive media often differ from response of the human eye within the same region of the spectrum. For example, the ideal blue wavelength for film exposure is approximately 450 nm, a value near the peak of the blue curve and near the minimum value of the green curve. Note that, for visibility to the human eye, however, a value of 480-490 nm would be much preferred. With the film sensitivity shown in FIG. 3, however, a 490 nm exposure would not be appropriate, since it would affect both blue and green layers to somewhat the same degree. Similarly, for the red layer, an optimal wavelength for the film would be in the 685-695 nm region. However, this wavelength may be difficult to perceive, being very near the edge of the visible spectrum. Note that a red LED, with a dominant wavelength typically near 625 nm, is optimal for traffic light or other visible uses. However, for film exposure, almost 4 times the amount of light is needed at this wavelength than would be required at 690 nm. Thus, it can be seen that the sensitivity of photosensitive media to wavelengths may even conflict with human eye response, for which LEDs are primarily designed.

Clearly, there are significant differences between what is required of the LED as a light source for display versus what is required as an exposure source for imaging onto photosensitive media. Because LEDs have been primarily developed for display applications, special techniques are required to adapt these devices to a high-speed writing apparatus.

LED Composition and Characteristics

FIGS. 1a, 1b, and 1c show, from top, side, and cross-sectional perspective views respectively, the construction of a conventional encapsulated discrete LED 32 used in indicator lamp and other display applications. Referring to FIG. 1a, a bond wire 27 is connected to an electrode 30 on an LED chip 25. For a typical device, discrete LED 32 is approximately 200 to 250 um square, with electrode 30 having a diameter in the 120 to 150 um range. Necessarily, electrode 30 covers a substantial portion of the light emitting area of discrete LED 32 in the desired emission direction. Referring to FIG. 1b, in which LED chip 25 is soldered to a substrate 29, the preferred emission direction for LED light is shown. However, as indicated in FIG. 1b, a considerable amount of light is emitted in undesirable directions, from the edges of LED chip 25. This is due, for example, to the reflective effects of the solder and to some reflectivity of electrode 30 itself. Bond wire 27 also blocks some amount of light. It is difficult to collect and use light emitted from these edges. In fact, because of the position of electrode 30, only a small amount of light is actually emitted along the preferred axis. The optical axis itself can be darker than off-axis areas.

Referring to the cross-section of discrete LED 32 shown in FIG. 1c, LED chip 25 is positioned within a reflector cup 24 which helps to collect some of the light emitted in an undesirable side direction and direct this light vertically in the desired direction. The conventional discrete LED 32 is encapsulated in an epoxy dome lens 28, which helps somewhat to direct light in the desired direction. Drive current is supplied from an anode lead 21, through a thin gold bond wire 27, then through LED chip 25, to a cathode lead 23. For cooling, convection and heat radiation are negligible. Instead, heat generated within discrete LED 32 must be conducted from discrete LED 32 by cathode lead 23. High thermal resistance reduces overall LED power and device lifetime.

The conventional design approach used for discrete LED 32, as shown in FIGS. 1a, 1b, and 1c, is acceptable for many display applications. However, as is noted in the above description, due to sensitometric response characteristics of photosensitive media and to drawbacks of conventional discrete LED 32 design, the conventional approach is relatively inefficient and is not well-suited to writing applications. Some improvements can be made in the design of discrete LED 32 devices. For example, referring to FIGS. 2a and 2b, there are shown top and side views, respectively, of an improved design for discrete LED 32. Here, two electrodes 30 are positioned in diagonal corners of LED chip 25, thereby eliminating the on-axis dark spot of convention discrete LEDs 32 and allowing increased light emission in the desired direction of the optical axis. In addition, drive current is more uniformly distributed within LED chip 25 with the arrangement of FIGS. 2a and 2b. However, thermal build-up remains a problem that is not sufficiently alleviated with the design solution of FIGS. 2a and 2b.

Solutions for Grouping LEDs

One method for obtaining higher levels of exposure energy from discrete LEDs 32 is to group together multiple discrete LEDs 32. The relatively small size of discrete LED 32 components makes this approach feasible within some limits. Referring to FIG. 4a, there is shown one example of a 3×3 array of discrete LEDs 32, in an arrangement of colors. Such an array of discrete LEDs 32, assembled on an LED mount plate 31, can be deployed to provide increased brightness where it is advantageous to use discrete LED 32 sources. As FIG. 4a shows, it may be advantageous to arrange discrete LEDs 32 in various patterns and to have relatively more discrete LEDs 32 of some colors, based on the spectral sensitivity of the photosensitive medium being exposed.

In a typical writing apparatus, the acceptance cone angle of the illumination system determines within what area discrete LEDs 32 can be placed on LED mount plate 31. In practice, suitable illumination optics typically have an acceptance cone angle of about f/4. With conventional lens components and design approaches, such as using a 25 mm diameter achromatic lens with a 100 mm focal length, for example, this would constrain the available area, requiring LEDs to be positioned within approximately a 1 inch square.

Because of simple light cone geometry, there are some limitations to light efficiency in providing multiple discrete LEDs 32 within a narrow illumination aperture, as shown with respect to FIGS. 5a and 5b. In FIG. 5b, discrete LED 32 emits light having an overall LED divergence angle 33 that exceeds an optics acceptance cone angle 34 of a collimating lens 36 for the illumination optics. A waste light portion 35 of emitted light from discrete LED 32 lies outside optics acceptance cone angle 34 and is, therefore, unusable within the printing apparatus. Where multiple discrete LEDs 32 are deployed, even where the emission cone angle is smaller than the optics acceptance cone angle, there can still be considerable unused light, as shown in FIG. 5a. Here, discrete LEDs 32 on the outskirts of LED mount plate 31 have an increased amount of unused light, making a larger contribution to waste portion 35 than do more centrally located discrete LEDs 32. Thus, simply increasing discrete LED 32 density has its limitations for providing increased exposure energy. Solutions using smaller discrete LED 32 components may provide a modest increase in exposure energy, but are also subject to similar inefficiencies due to angular divergence.

An alternate approach for providing sufficient exposure energy is the use of large area LED devices having patterned electrodes, as shown in FIGS. 7a and 7b. This approach provides, from a relatively small illumination area, the equivalent energy of an array of discrete LEDs 32. Commercial versions of compact large area LED devices include Luxeon Star devices available from Lumileds Lighting, LLC, located in San Jose, Calif. or similar components available from Cree, Inc., located in Durham, N.C., for example. Referring to FIG. 7a, one type of large area LED device, a patterned electrode LED 134, has a patterned electrode 40 that spreads current uniformly through LED chip 25 without substantially obstructing emission in the desired direction. FIG. 7b shows a side view of patterned electrode LED 134. By way of comparison, LED chip 25 used in patterned electrode LED 134 is approximately 2 mm on an edge, about ten times the length of a standard LED chip 25 as used in a conventional discrete LED 32. However, patterned electrode LED 134 is still small enough to be sufficiently collimated by a single lens. A custom lenslet array is not required.

FIG. 8a shows, in more detail, how patterned electrode LED 134 such as the Luxeon Star device is constructed. A large area LED 46 is mounted on a metal heatsink 48 and is connected externally by electrical leads 43 and internally by bond wires 27. The device is covered by a clear plastic lens 128. As shown in FIG. 8b, auxiliary collector optics can be added to increase light intensity from patterned electrode LED 134. A collector cone 41, such as a plastic molded component, serves as a light guide and provides both collimating and reflective optics for directing the emitted light. Collector cone 41 comprises an integrally molded collimating lens 36 to aid in collimating emitted light received at its input end to provide narrower angle emission. Additionally, collector cone 41, as a prism structure, acts as a guide element using total internal reflection (TIR) to help redirect the wider angle emissions. It can be seen that the patterned electrode large area LED goes a long way towards providing a light source for film imaging applications, providing relatively high radiance, high power, small emission angle, and small source area, and having reduced tendency for thermal buildup and absence of a "dead spot" on axis.

While solutions such as clustering LEDs and combining patterned electrode LED 134 with collector cone 41 provide some improvement for achieving high levels of exposure energy from LED sources, it can be appreciated that significant difficulties remain. In order to provide sufficient exposure energy for printing at efficient speeds, even more intense illumination energy is needed. At the same time, however, this energy must be emitted from a small source, from within a limited area, and at low divergence angles.

Conventional approaches currently allow writing speeds of up to about 1 frame/second. Commercial viability, however, demands speeds approaching 24 frames/second. Because increases in exposure energy translate directly to potential increases in writing speed, even incremental improvements in providing increased exposure energy can be beneficial, provided that the necessary area limitations and divergence angle constraints are met.

Thus, there is a need for an improved printing apparatus capable of high speed printing onto photosensitive media and utilizing high-intensity LED illumination.

SUMMARY OF THE INVENTION

The present invention provides an improved light source for providing an illumination beam along an illumination axis, comprising:

(a) a plurality of large area LEDs, mounted on a base, for generating emitted light;

(b) a collector structure for collecting the emitted light from the plurality of large area LEDs to form the illumination beam, the collector structure comprising:

for each LED, a light guide for collecting, at an input, the emitted light received from the LED and directing the emitted light to an output, along the illumination axis, the light guide comprising:

(i) a collimating element near the input for collimating a portion of the emitted light to direct collimated light in the direction of the illumination axis; and (ii) a guide element for directing some of the other emitted light at the input to the output and along the illumination axis;

wherein, the output of at least a first light guide has at least one flat edge for butting against the output of at least a second light guide.

It is a feature of the present invention that it deploys multiple LEDs having different wavelengths, based on sensitivity characteristics of the photosensitive medium. The apparatus and methods of the present invention take advantage of some of the features and affordability of LED components, while configuring these devices in suitable ways for writing to film and other photosensitive media. For example, the present invention takes advantage of the narrow-band emission, relatively high efficiency, fast switching rates, relatively low cost, small size, and minimal heat and IR emission of LEDs.

It is an advantage of the present invention that it increases the amount of light energy available for printing when using LED sources using a number of arrangements and optical support components.

It is a further advantage of the present invention that it allows compact arrangements of LEDs used as exposure light sources.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIG. 8b shows a collimator/reflector structure used with the LED of FIG. 8a;

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figure 18:
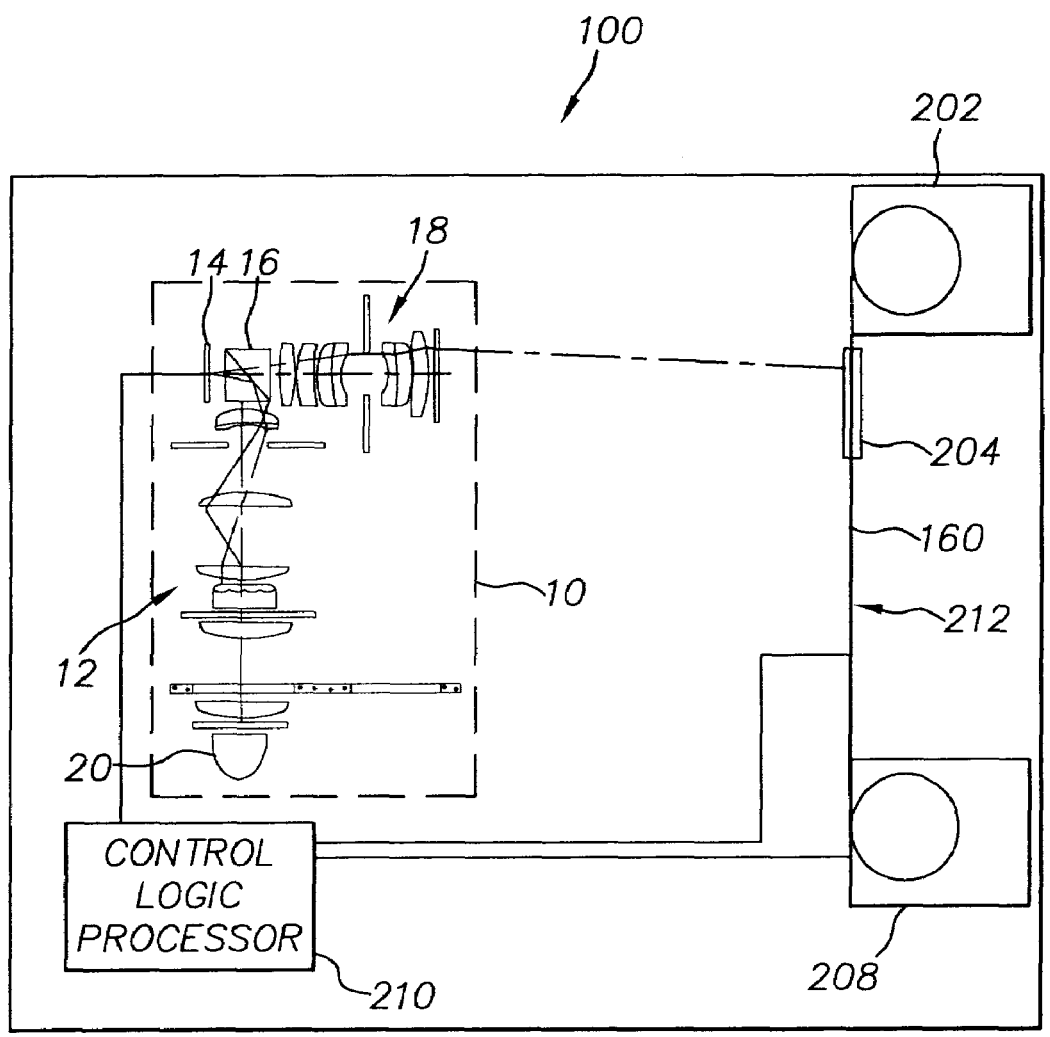
FIG. 18 is a schematic view of a printing apparatus according to the present invention.

FIG. 18 schematically illustrates a printer apparatus 100 for printing onto a photosensitive medium 160, such as a motion picture print film. Printer apparatus 100 comprises an optics assembly 10 and a media handling subsystem 212. Media handling subsystem 212 comprises a film supply 202, an exposure section 204, and a film storage unit 208. A control logic processor 210 accepts and processes image data for printer apparatus 100 and controls the overall operation of optics assembly 10 and media handling subsystem 212 components. The operation of printer apparatus 100 follows the general pattern used for other printer types. To print, an unexposed section of a photosensitive medium 160 is advanced from film supply 202 into exposure section 204. Optics assembly 10 cooperates with control logic processor 210 to print image data onto photosensitive medium 160. The exposed section of photosensitive medium 160 is then ready for processing in order to develop the image.

Within optics assembly 10, are the components for forming the image and focusing the image onto photosensitive medium 160. A light source 20 directs monochromatic light having one of a set of possible colors to a polarizing beamsplitter 16 which directs light having suitable polarization state to a spatial light modulator 14, an LCD in a preferred embodiment. Spatial light modulator forms the image by modulating the polarization state of incident light and reflects the modulated light, which is then focused onto exposure section 204 by focusing optics 18. Uniformizing optics 12 homogenize light from light source 20 to provide a uniform field for modulation by spatial light modulator 14.

Figure 1A:
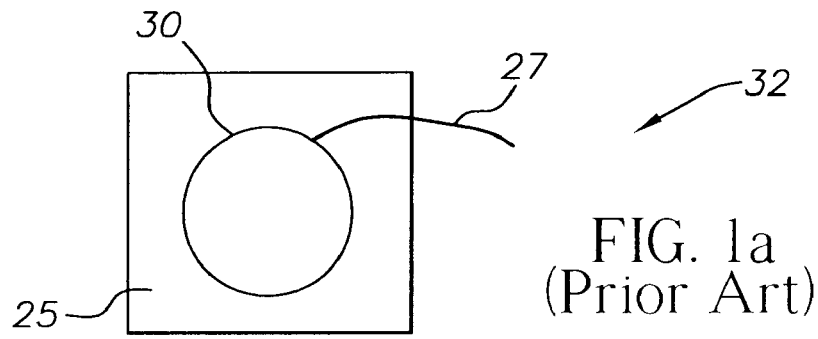
FIGS. 1a, 1b, and 1c show fabrication details for conventional discrete LEDs, such as LEDs used for display.
Figure 1B:
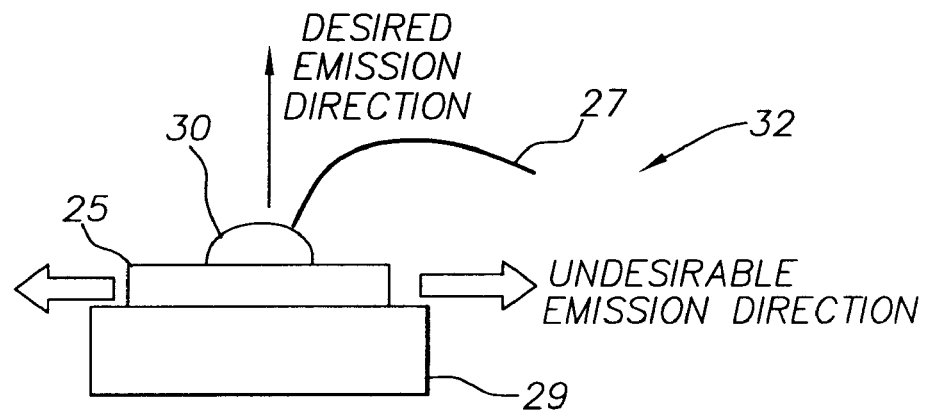
Figure 1C:
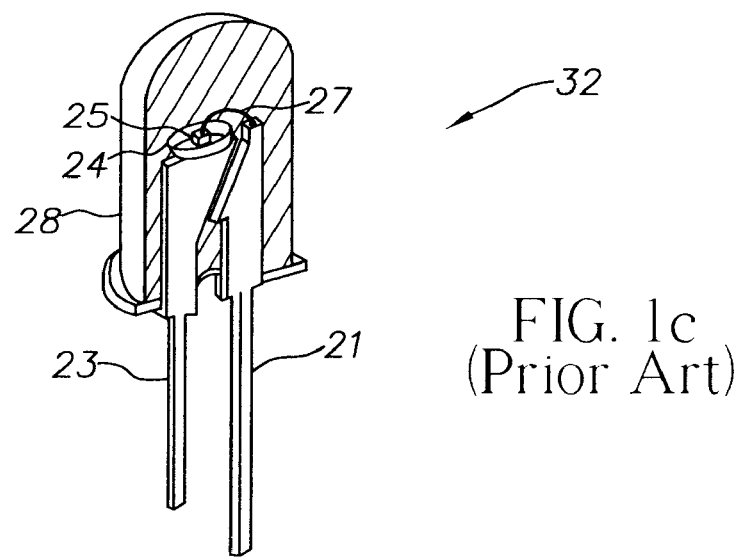
Figure 2A:
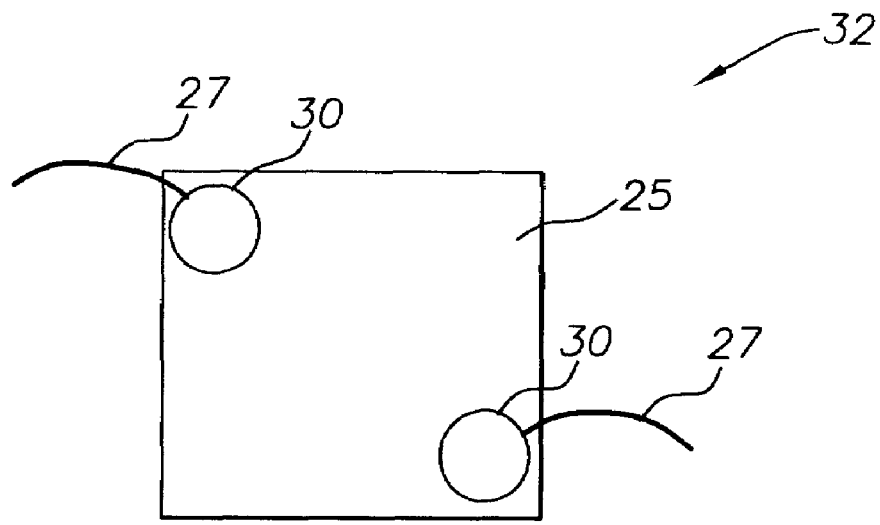
FIGS. 2a and 2b show, in top and side views respectively, fabrication details for an improved LED design using corner electrodes.
Figure 2B:
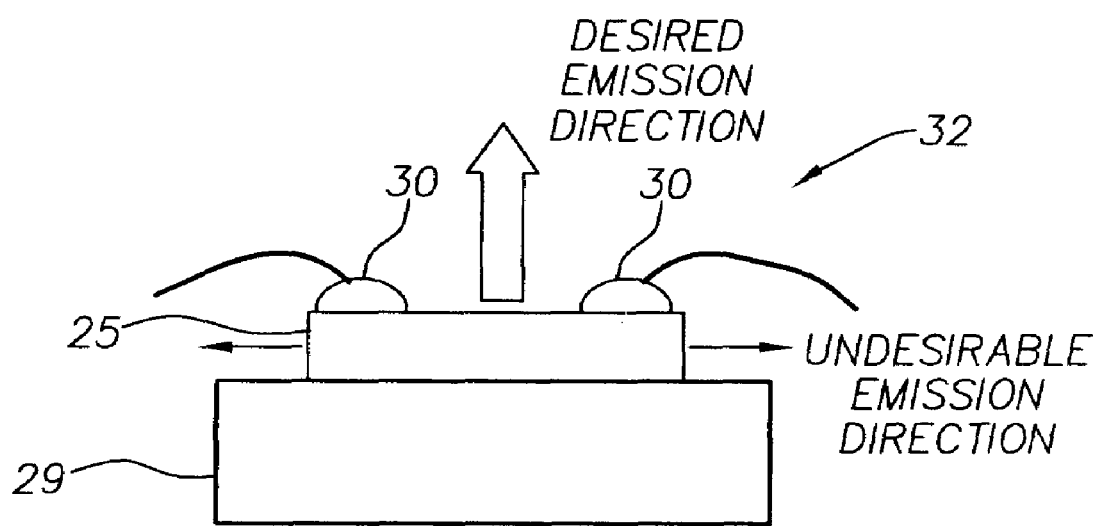
Figure 3:
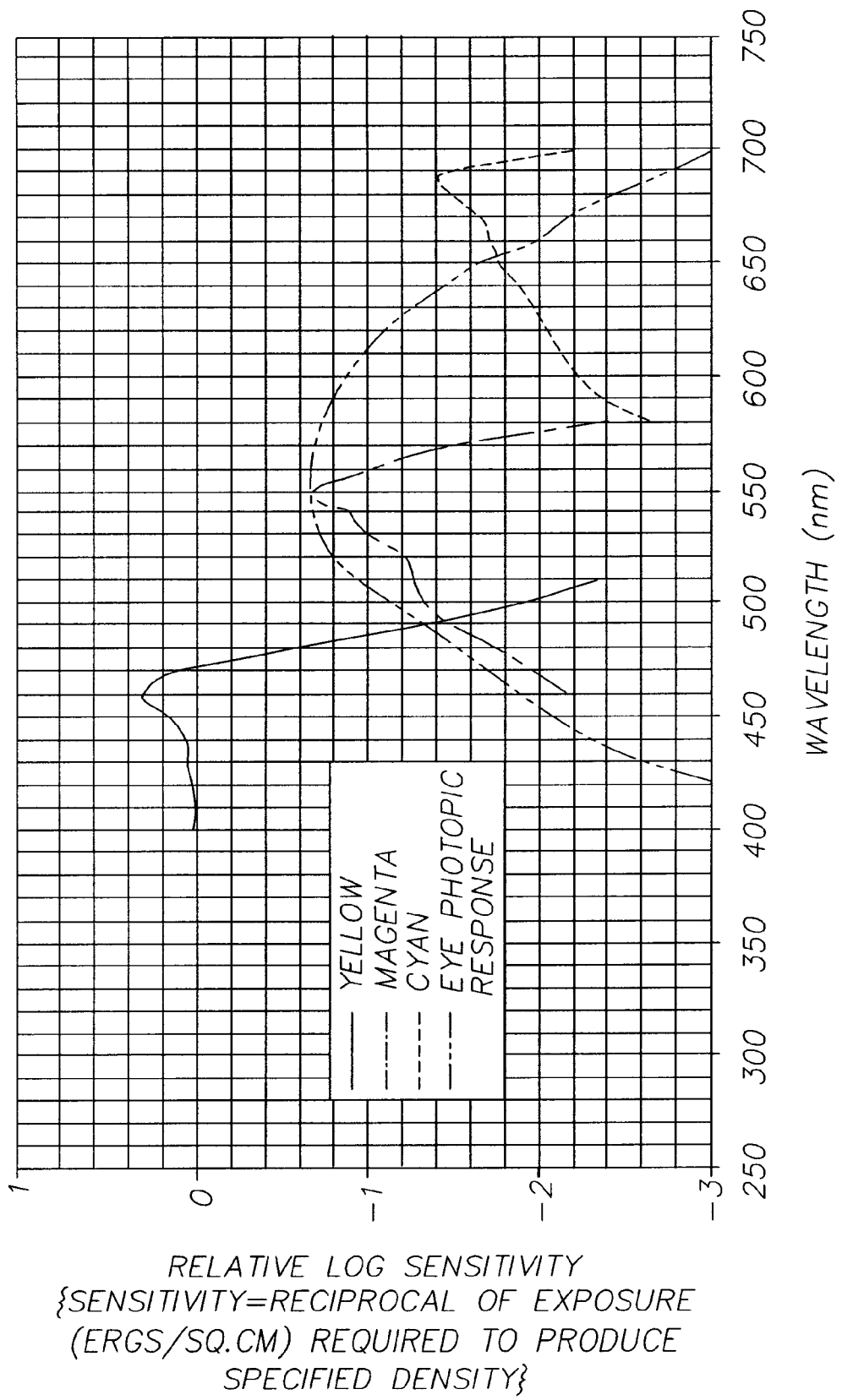
FIG. 3 gives a graph of representative sensitivity characteristics for a typical color internegative film, along with an overlaid normalized graph showing the photopic response of the human eye.

For the present invention, light source 20 uses a combination of LED sources in an array, arranged to provide sufficient exposure energy for high-speed processing of photosensitive medium 160. As is shown in the various embodiments described herein, the LED sources at light source 20 can be all the same color. Alternately, LED sources at light source 20 can be of different colors, separately energized to expose successive frames of photosensitive medium 160. Sensitivity of photosensitive medium 160 to various wavelengths, as shown in FIG. 3, is an important factor in light source 20 design. As is noted in the background discussion above, light source 20 has an effective illumination area of about one square inch. An important goal for high-speed performance is to provide, from light source 20, maximum radiance for exposure of photosensitive medium 160.

Figure 13:
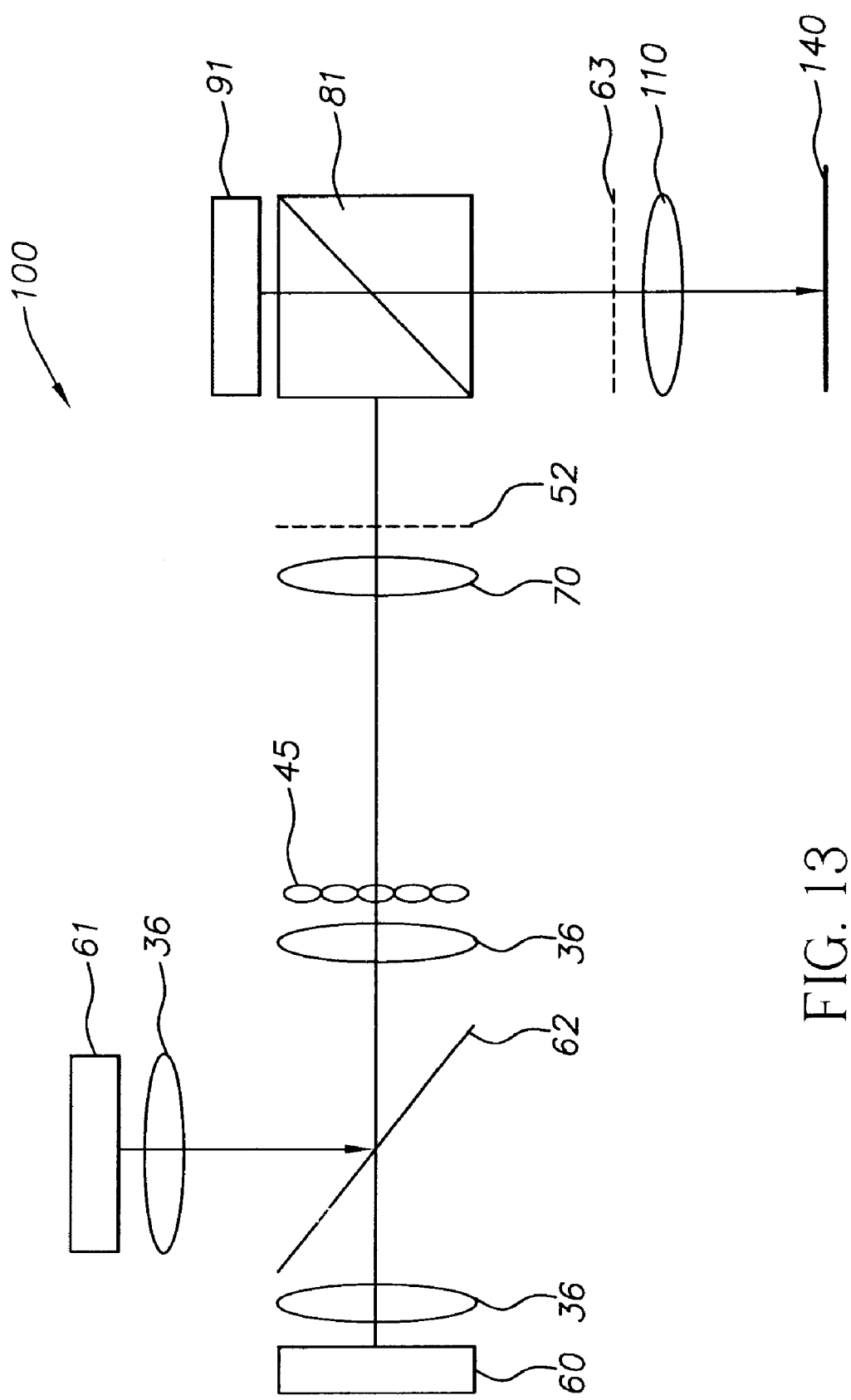
FIG. 13 is a schematic view of a printing apparatus according to the present invention, using multiple illumination sources combined through a dichroic mirror.

Referring to FIG. 13, there is shown an alternate design approach for printing apparatus 100 for sequential imaging in which, sharing the use of a single modulator for all colors, light source 20 may utilize more than one array of LED sources, optically along a common illumination axis. During a first periodically repeating time interval, a red LED array 60 provides source illumination along an illumination axis I. During a second periodically repeating time interval, green light from a green and blue LED array 61 provides source illumination. Similarly, during a third periodically repeating time interval, blue light from green and blue LED array 61 provides source illumination. A dichroic mirror 62 combines light from green and blue LED array 61 and red LED array 60 and directs the light through collimating lens 36 and uniformizing optics 45 along illumination axis I. Additional collimating lenses 36 are provided for each LED array 60 and 61. A telecentric condenser lens 70 relays the illumination through a polarizer 52 to a polarizing beamsplitter 81. Light reflected from polarizing beamsplitter 81, having the proper polarization state, is then modulated at a spatial light modulator 91, passes through polarizing beamsplitter 81, and is output along an output axis O, through an analyzer 63 to a print lens assembly 110 which focuses the image onto a photosensitive medium 140.

Dichroic mirror 62 can help to adapt the characteristics of the LED sources to the specific film or other photosensitive medium 140. For example, dichroic mirror 62 can be designed to clip the shorter wavelengths of the red emission to minimize unwanted green exposure. This would obviate the need for an optional filter.

The design of FIG. 13 admits a number of variations, as would be familiar to those skilled in the optical design arts. Uniformizing optics 45 could comprise a lenslet array, an optical tunnel, an integrator bar, or even an integrating sphere, for example. Polarizing beamsplitter 81, shown schematically as a MacNeille prism, could alternately be embodied as a wire grid beamsplitter. Analyzer 63 may not be necessary if the contrast ratio is acceptable. Further, any of the improved embodiments of light source 20, described herein below, could be employed in printer apparatus 100 as shown in FIG. 13, as well as with those printer apparatus 100 embodiments shown in FIGS. 16a-16d, 17, or 18.

Figure 16B:
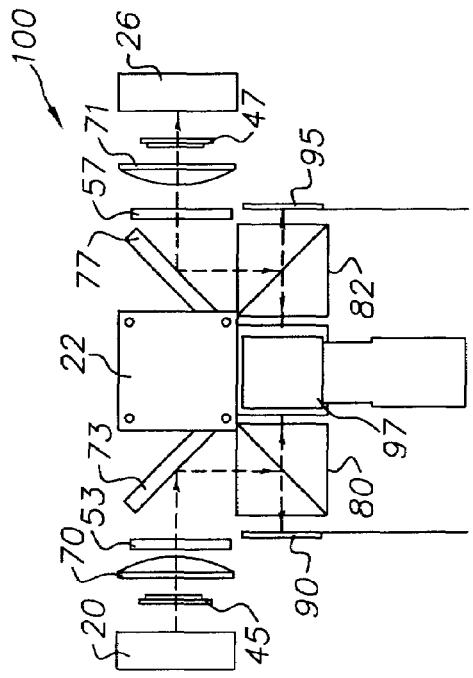
FIGS. 16a, 16b, 16c, and 16d show multiple views of a writing apparatus of the present invention that employs three spatial light modulators.
Figure 16D:
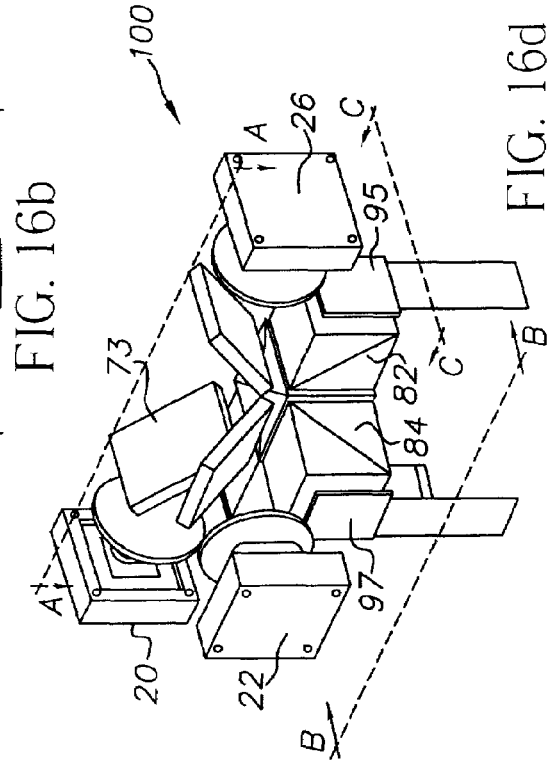
Figure 16A:
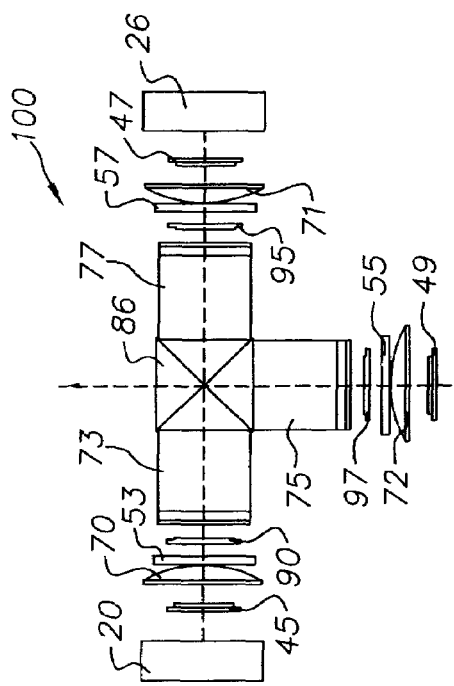
Figure 16C:
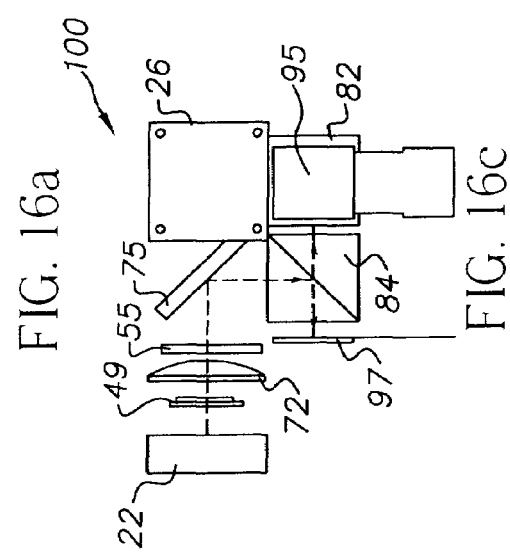

Referring to FIGS. 16a, 16b, 16c, and 16d, there are shown schematic and perspective views of printing apparatus 100 in an embodiment using a separate light source and modulator for each color. Referring particularly to FIGS. 16a, 16b, and 16c, light sources 20, 22, and 26 direct light (typically red, green, and blue light) through uniformizing optics 45, 49, and 47; through telecentric condenser lens 70, 72, 71; through polarizers 53, 55, and 57; through folding mirrors 73, 75, 77; through polarizing beamsplitters 80, 84, and 82; to reflective spatial light modulators 90, 97, and 95 respectively. Modulated light is transmitted through polarizing beamsplitters 80, 84, and 82 to an X-cube combiner 86, which combines the separately modulated color beams along an output axis for writing. FIG. 16d shows one example for spatial positioning of these illumination and modulation components within printing apparatus 100.

In the arrangement shown in FIGS. 16a, 16b, 16c, and 16d, light sources 20, 22, and 26 each comprise an LED array configured with one of the embodiments disclosed herein. Spatial light modulators 90, 97, and 95 are reflective LCDs. The arrangement of FIGS. 16a, 16b, 16c, and 16d allows simultaneous exposure of photosensitive medium 140. Because this design allows maximum power for each color and simultaneous writing of colors, writing speed is maximized when using this arrangement.

Figure 17:
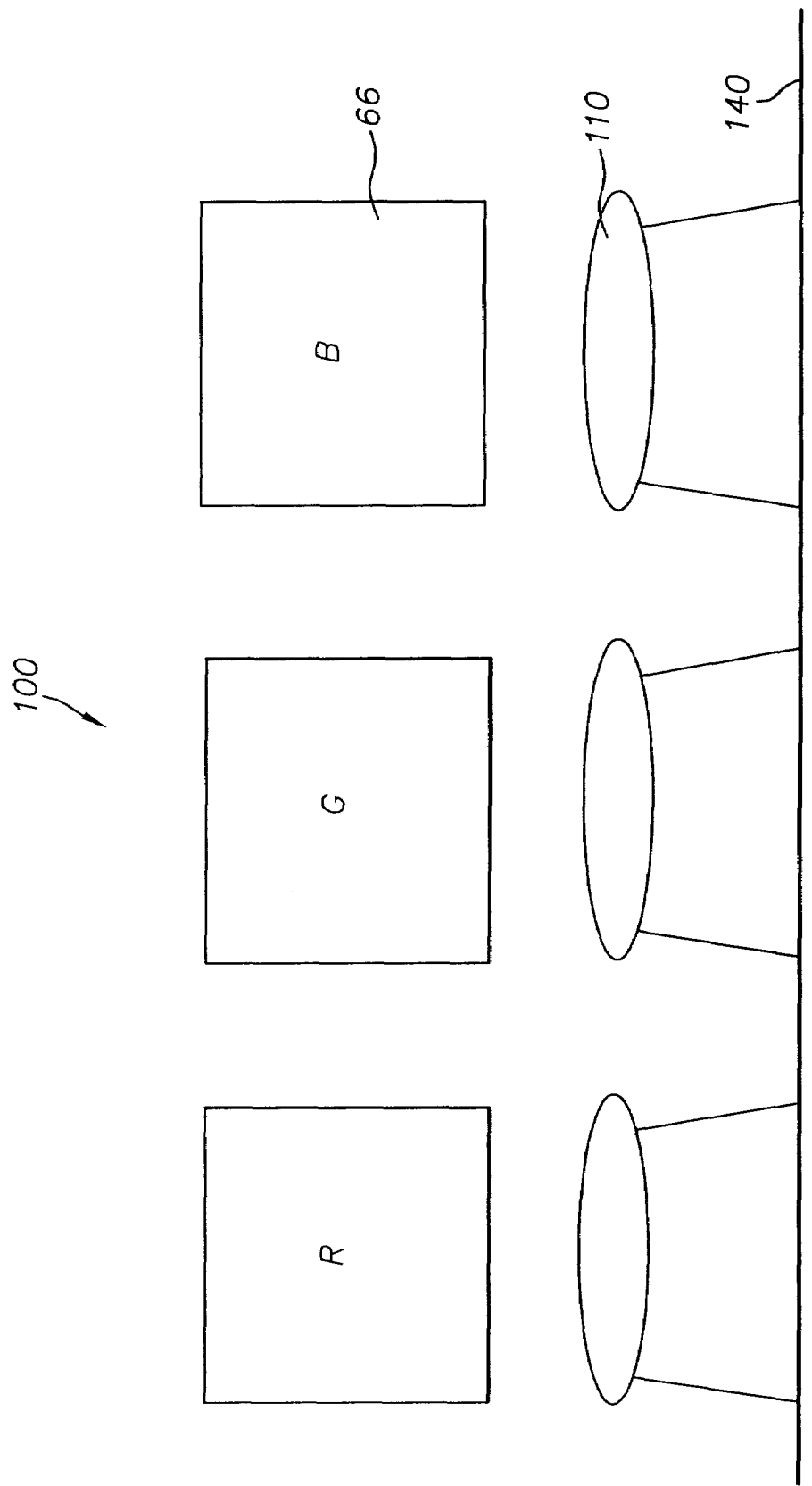
FIG. 17 is a schematic diagram of an alternate printing apparatus having three separate writing heads, one for each color.

Referring to FIG. 17, there is shown yet another embodiment of printing apparatus 100 wherein a separate single-color writer module 66 provides exposure to print lens 110 for each color. Each single-color writer module 66 could have the structure of optics assembly 10 in FIG. 18, for example. With the arrangement shown in FIG. 17, photosensitive medium 140 is indexed from one position to the next in order to expose all colors for each image frame. All three single-color writer modules 66 image simultaneously for successive image frames. With this arrangement, for example, one color writer module 66 writes the red component of an image frame. The next color writer module 66 in sequence writes the green component. The last color writer module 66 writes the blue component. Using this arrangement, imaging optics can be optimized for specific colors, minimizing chromatic aberrations.

Basic Embodiment—Hexagonal Arrangement of Discrete LEDs 32

Figure 4A:
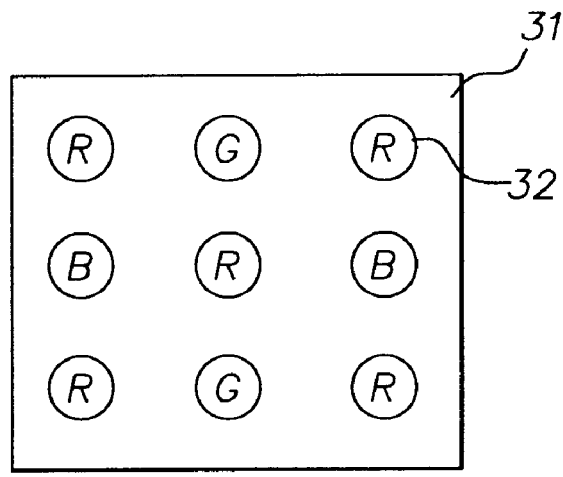
FIG. 4a shows a front view of a 3×3 array of LEDs containing five red, two green and two blue LEDs.
Figure 4B:
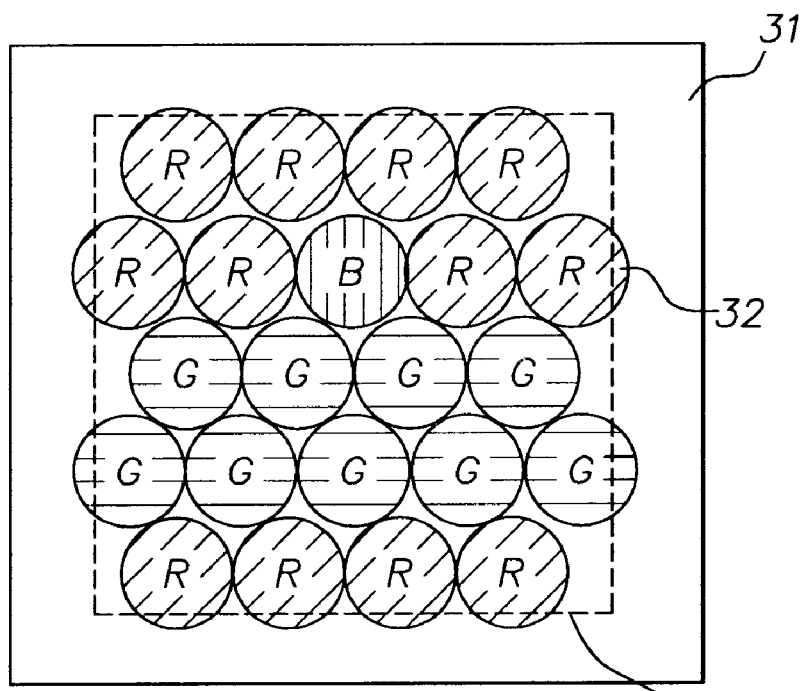
FIG. 4b shows a front view of an array having multiple LEDs packed in a honeycomb arrangement for maximum packing density.
Figure 5A:
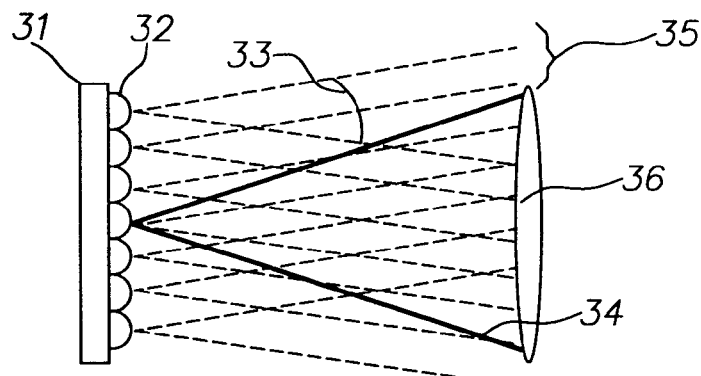
FIG. 5a is a schematic drawing that shows an LED array where some light from the outermost LEDs is not collected by the lens.
Figure 5B:
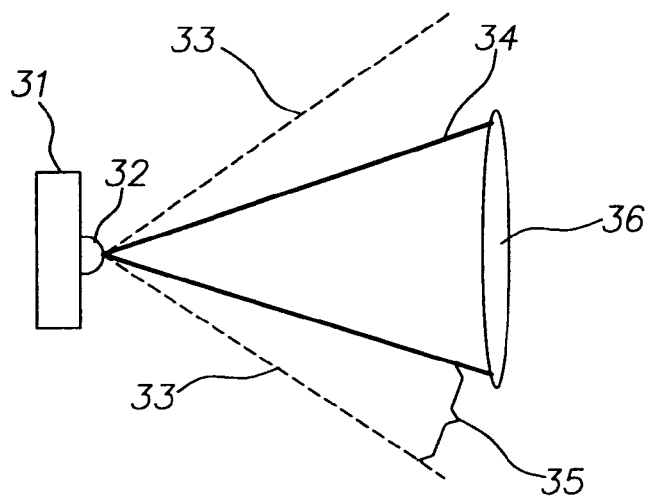
FIG. 5b is a schematic drawing that shows an LED with wide emission angle that exceeds the acceptance cone angle of the lens.

Referring to FIG. 4b, there is shown, from a front view, a first embodiment for light source 20 in the present invention. LED mount plate 31 serves as a support for a number of discrete LEDs 32, arranged in a hexagonal or honeycomb pattern. The hexagonal pattern allows the closest possible packing of discrete LEDs 32 in the same plane. In the best arrangement, discrete LEDs 32 would be substantially within the bounds of a 1-inch square source area, as shown. In the arrangement of FIG. 4b, twenty-two discrete LEDs 32 are provided: twelve red, nine green, and one blue discrete LED 32. The number of different color devices corresponds closely to sensitivity differences in photosensitive medium 160, as suggested in FIG. 3. Important factors in determining the number and type of discrete LEDs 32 of each color include emitted wavelength, sensitivity of photosensitive medium 160, exposure time considerations, and LED output power. For example, for a specific photosensitive medium 160, needed exposure levels for red, green, and blue light, respectively, may be 10, 6, and 2 ergs per square centimeter. As an example, where discrete LEDs 32 have equal output power and suitable wavelength characteristics, ten red, six green, and two blue discrete LEDs 32 would be needed for an arrangement similar to that shown in FIG. 4b, assuming equal exposure times.

Single-Substrate Embodiment

Figure 6A:
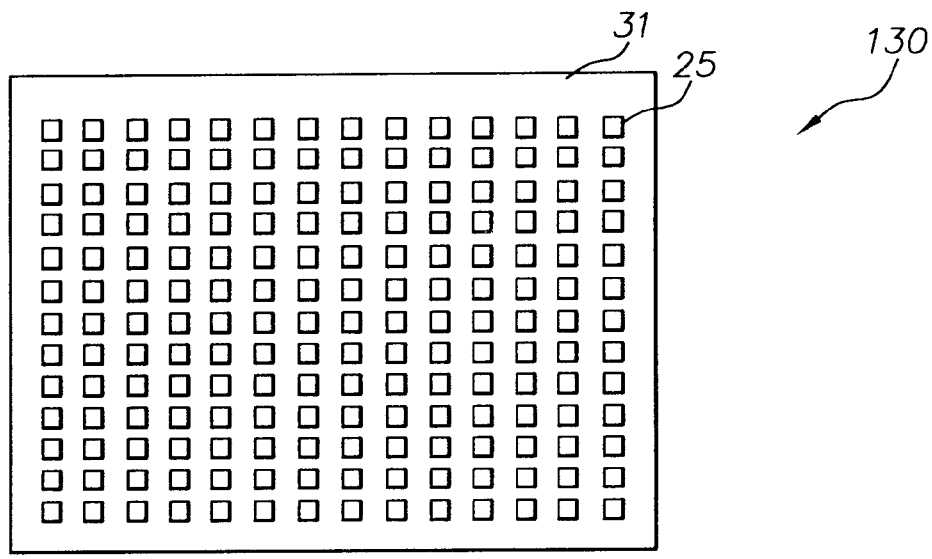
FIG. 6a is a top view of an LED array comprising an arrangement of individual LED elements on a common baseplate.
Figure 6B:
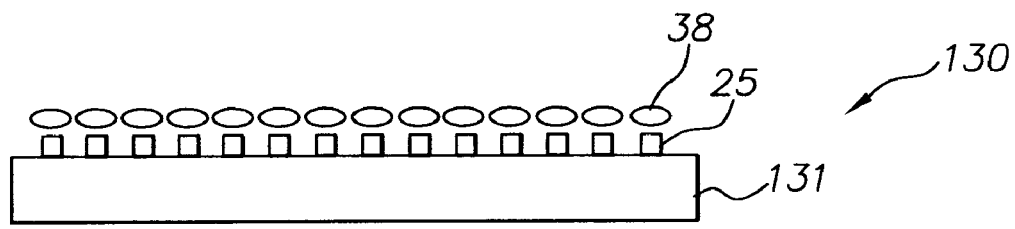
FIG. 6b is a side view of the LED array of FIG. 6a, showing a custom lenslet array for collimating light from each LED element.
Figure 7A:
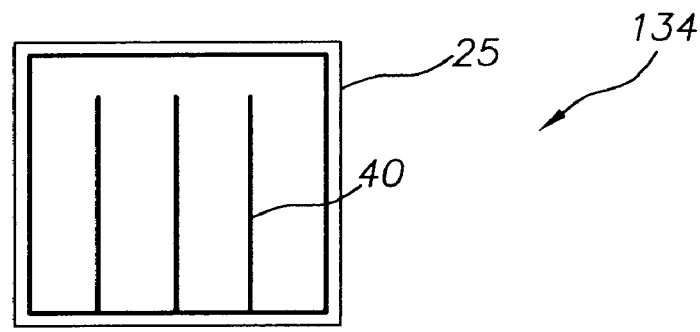
FIGS. 7a and 7b show top and side views, respectively, of an improved LED having interdigitated electrodes.
Figure 7B:
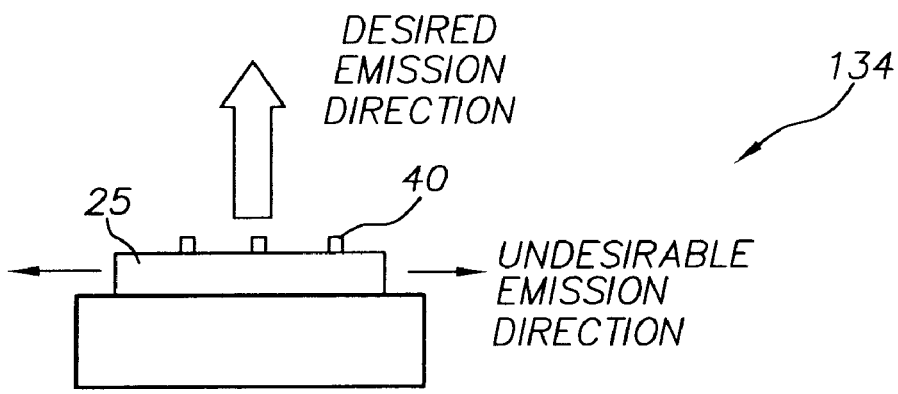

Alternative solutions for increasing exposure energy output from LED sources include using more compact fabrication. Referring to the schematic plan view and side views of FIGS. 6a and 6b, respectively, an LED array 130 has been fabricated by mounting LED chips 25 onto a substrate 131, leaving an appropriate interchip gap for bond wire routing. To fabricate LED array 130, LED chips 25 were mounted and wired, then LED array 130 coated with an epoxy or other suitable protectant. The example of FIG. 6a shows fabrication of a 14×14 chip LED array 130. To provide collimation, a custom lenslet array 38 can be aligned to LED chips 25 in LED array 130 and can then be permanently attached. While solutions of the type shown in FIGS. 6a and 6b have been attempted, results can be disappointing, due to high fabrication costs and significant internal light loss.

Clustered Embodiment with Single Collector Cone 41

Figure 8A:
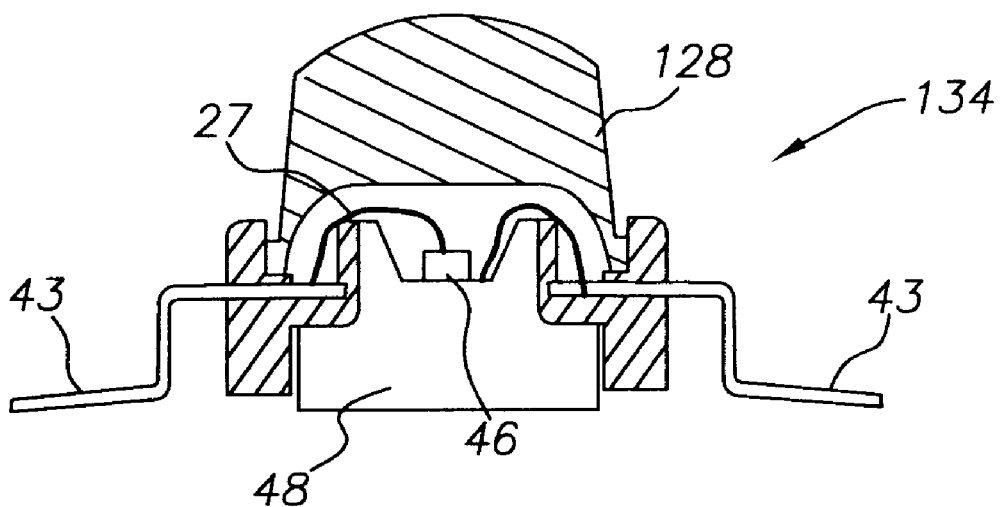
FIG. 8a shows a cross sectional view of an improved LED.
Figure 8B:
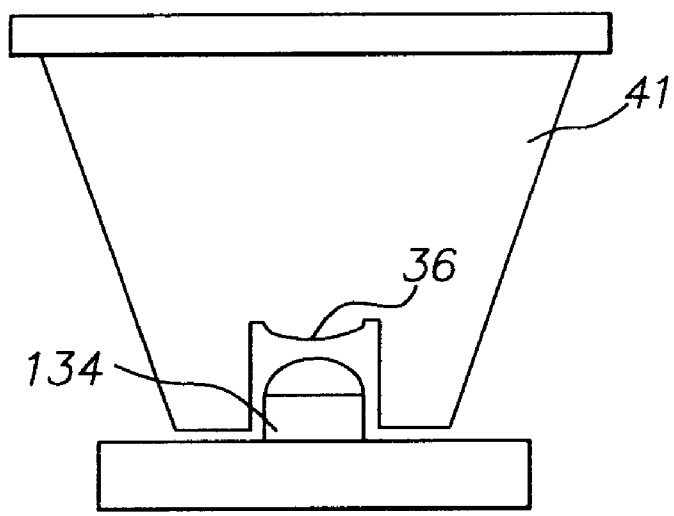
Figure 9:
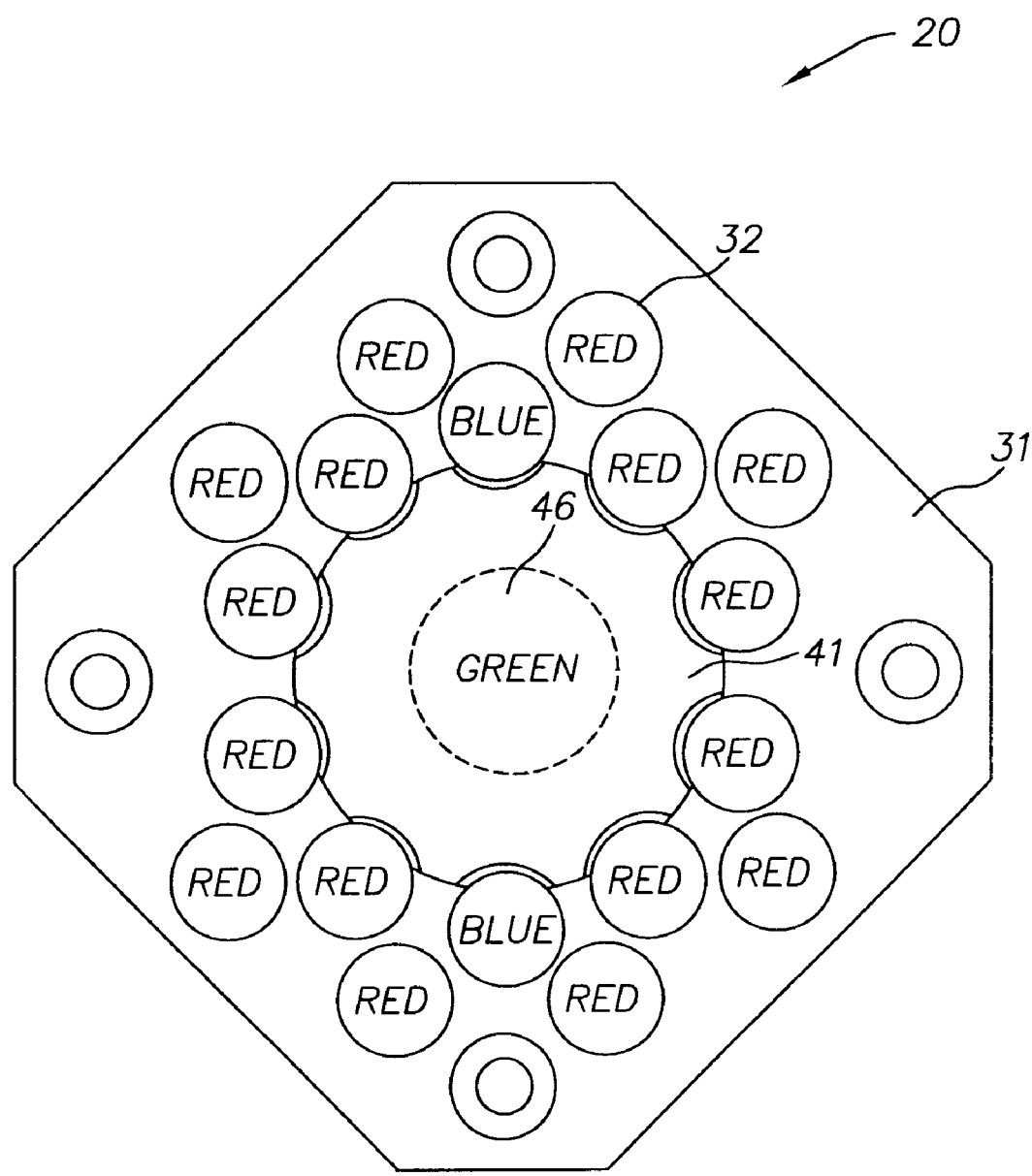
FIG. 9 shows a multicolor LED array having a single LED with a collimator/reflector structure, surrounded by discrete LEDs of different color.

Referring to FIG. 9, there is shown, in a front view, another alternate embodiment of light source 20 in which a multicolor array is formed using a plurality of LEDs. At the center, a single green large area LED 46 is provided with collector cone 41 as is shown in FIG. 8b. Additional discrete LEDs 32 are also provided on LED mount plate 31. Collector cone 41 is notched to accommodate closely packed, neighboring red and blue discrete LEDs 32. The arrangement of FIG. 9 is suitable because large area LEDs 46 is several times as bright as conventional discrete LEDs 32, particularly when combined with collector cone 41.

Clustered Embodiments with Multiple Collector Cones 41

Figure 10A:
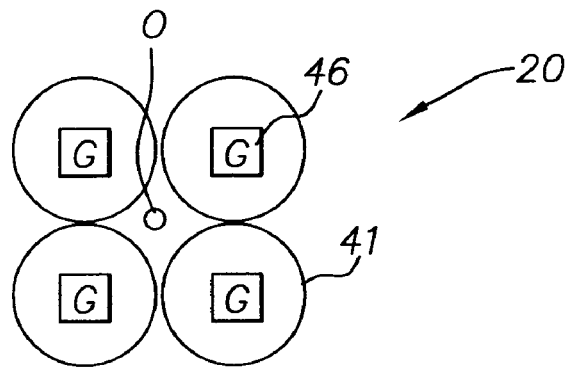
FIG. 10a shows a light source configuration with four LEDs of a single color, each having a modified collimator/reflector structure.

Referring to FIG. 10a, there is shown an arrangement of collector cones 41 for use in light source 20. As this arrangement shows, none of collector cones 41 and none of large area LEDs 46 are centered on optical axis O. Thus, this arrangement is relatively inefficient, with a dark spot centered on optical axis O.

Figure 10B:
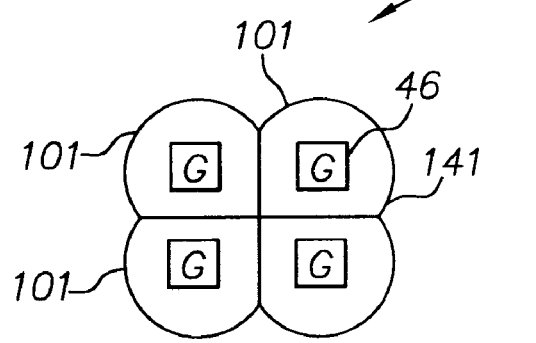
FIG. 10b shows, from a front view, a light source configuration with four LEDs of a single color, each having a collimator/reflector structure of the present invention.

Referring to FIG. 10b, there is shown, from a front view, an improved arrangement having multiple large area LEDs 46 of the same color in a multicone structure 141. Unlike the arrangement with separate collector cones 41 as shown in FIG. 10a, multicone structure 141 directs the emitted light more closely to optical axis O.

Multicone structure 141 is formed by fitting a plurality of cone segments 101 together. Cone segments 101 can be cut, molded, or otherwise shaped in order to provide a compact arrangement in which output sections of cone segments 101 are butted against each other. This arrangement maximizes the contribution of each large area LED 46 to on-axis illumination.

Figure 10C:
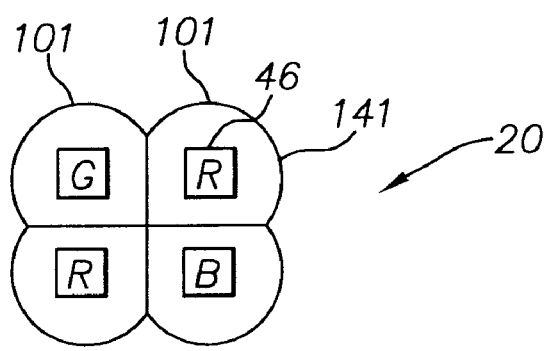
FIG. 10c shows, from a front view, a light source configuration with four LEDs of different colors, using the collimator/reflector structure of the present invention.
Figure 12:
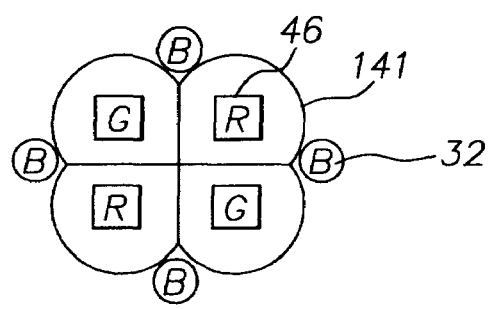
FIG. 12 shows an alternate arrangement in which a light source has red and green LEDs in a four leaf clover structure similar to that shown in FIG. 10a, with additional blue LEDs added to form a multicolor array.

The example of FIGS. 10a and 10b provide a single color. For some types of imaging apparatus, individual color light sources 20 are appropriate. Various alternate arrangements are possible. For example, the embodiment of FIG. 10c shows an arrangement in which different colors can be deployed within a cluster. Here, red, green, and blue large area LEDs 46 are provided with multicone structure 141. Alternatively, in FIG. 12, blue discrete LEDs 32 are placed near multicone structure 141 for red and green large area LEDs 46 to provide blue wavelengths.

It must be emphasized that, for printing applications, a key design consideration is the relative sensitivity of the photosensitive film or other medium at various wavelengths. With the motion picture medium having the response shown in FIG. 3, for example, an ideal red wavelength for the red layer would be 690 nm. Typical red display LEDs, on the other hand, have peak wavelengths at 625-640 nm. Based on the relative sensitivity from FIG. 3, almost four times the intensity would be needed at 625 nm than is needed at 690 nm. This does not preclude the use of red LEDs having the lower wavelength value; instead, this relationship simply determines how many red large area LEDs 46 of the standard type are required.

Embodiments Allowing More Compact Packaging of Large Area LEDs 46

Figure 11A:
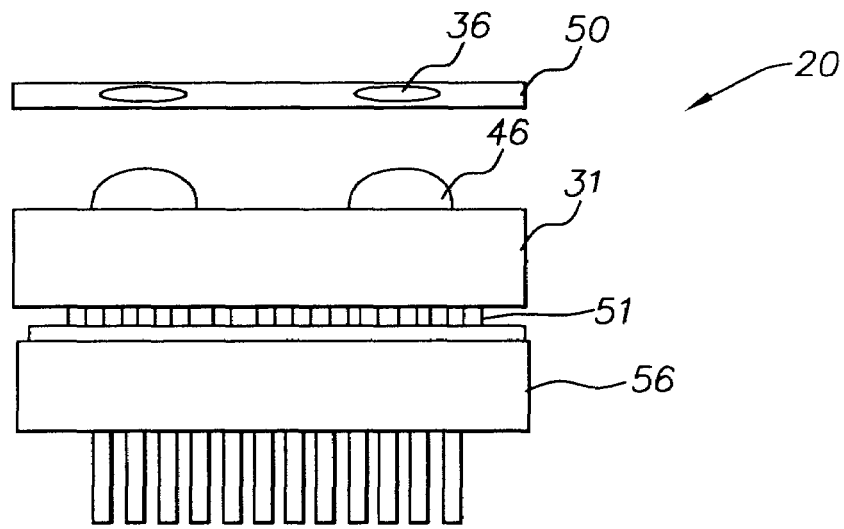
FIG. 11a shows four improved LEDs, mounted on a thermoelectric cooler, with an aperture plate containing collimator lenses.

Reducing generated heat extends both LED lifetime and allows operation at increased power and brightness levels. Referring to FIG. 11a, there is shown, from a side view, an embodiment of light source 20 that allows even denser packing and larger LEDs. Large area LEDs 46, such as the Luxeon devices noted above, are mounted on LED mount plate 31. To increase both power output and lifetime, a thermoelectric cooler 51 is placed in contact with LED mount plate 31. A heatsink 56 is also provided to dissipate the generated heat. For each large area LED 46, an aperture plate 50 mounts a corresponding discrete collimating lens 36. Note that FIG. 11a shows a side view; from a top view, four or more large area LEDs 46 could be clustered together as with the embodiments of FIGS. 10a and 10b.

Figure 11B:
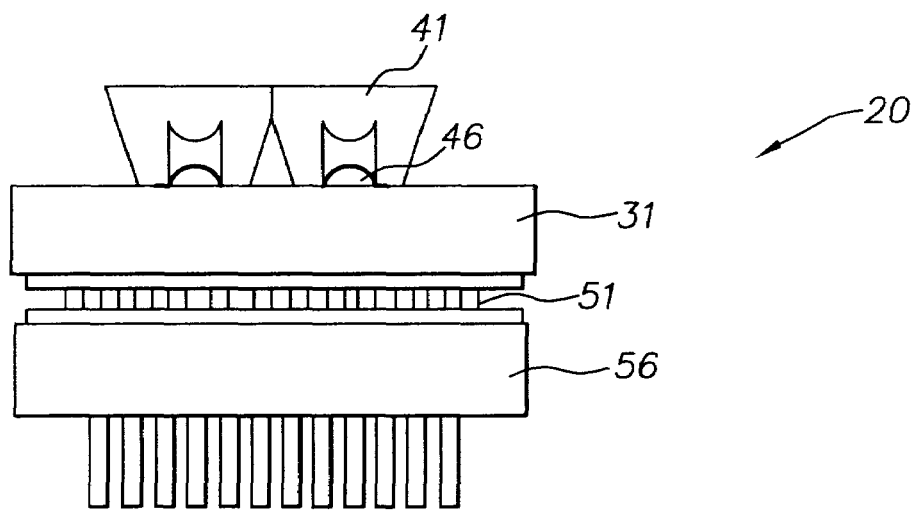
FIG. 11b shows a light source configuration with four LEDs of a single color, each having a modified collimator/reflector structure, mounted on a thermoelectric cooler.

Referring to FIG. 11b, there is shown another optional embodiment, with collector cones 41 used together with large area LEDs 46 for collimation and collection of emitted light. As is indicated in FIG. 11b, collector cones 41 may be shaped to fit closely against each other.

Figure 14A:
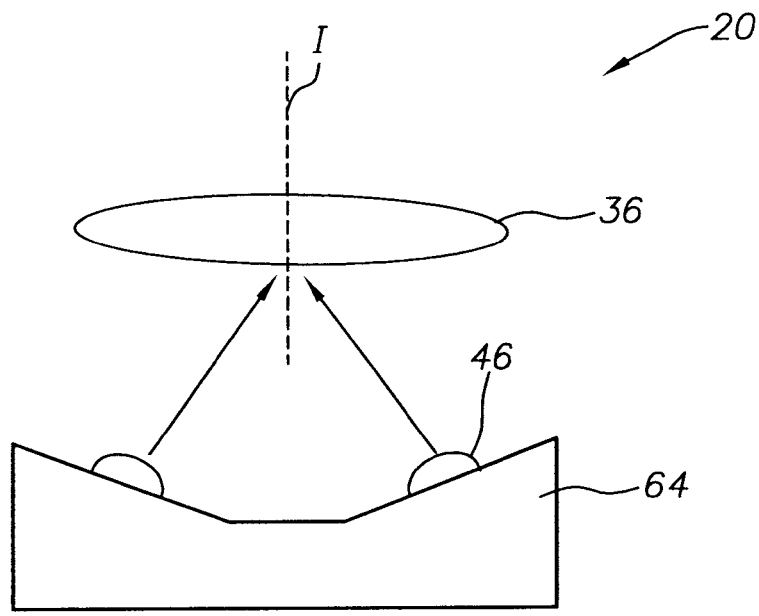
FIG. 14a is a side view showing a structure in which multiple LEDs are mounted on an angled surface, thereby directing light toward the center of a collimating lens.
Figure 14B:
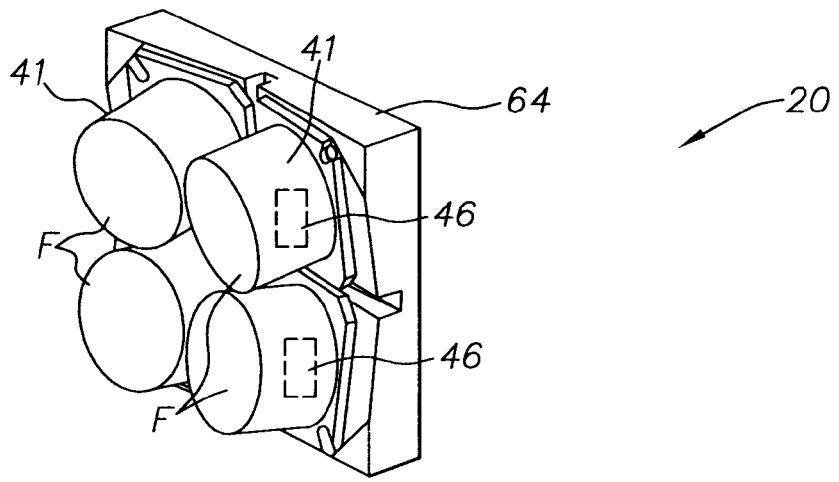
FIG. 14b is a perspective view of the device having LEDs mounted on an angled surface, as shown in FIG. 14a, where the LEDs include the collimator/reflector structure shown in FIG. 8b.

Referring to FIGS. 14a and 14b, there is shown, in side view and perspective view, respectively, an embodiment of light source 20 in which large area LEDs 46 are deployed on an angled mounting surface 64. Here, angled mounting surface 64 is generally of a concave shape with respect to the illumination axis I. Optionally, some degree of curvature could also be provided to shape angled mounting surface 64. The arrangement of FIGS. 14a and 14b directs light toward a point F that represents an ideal aperture for collimating lens 36 along the illumination optics axis.

While collector cones 41 provide one type of useful mechanism for directing light from large area LEDs 46, other types of structure could be used. For example, appropriately shaped glass prisms could be employed, each shaped to include a collimating input element and to use total internal reflection for directing light to an output.

Embodiment to Improve Efficiency of Light Collection

Figure 15:
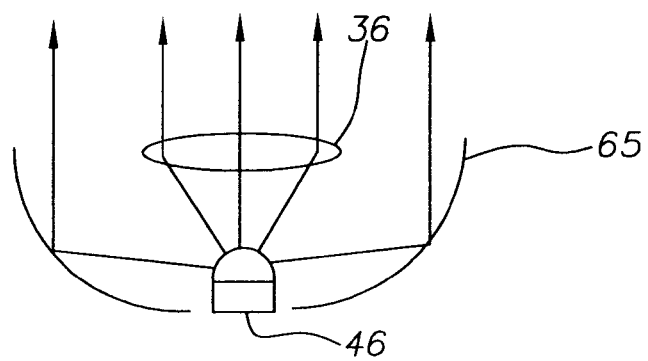
FIG. 15 shows an LED configured with a collimating lens and a parabolic reflector to aid in light collection and collimation.

Referring to FIG. 15, there is shown an arrangement for improved light efficiency. Large area LED 46 is located at the focus of a parabolic reflector 65 that collimates widely divergent rays. Collimating lens 36 collimates the less divergent rays. This design is an improvement over collector cone 41 of FIG. 8b which simply sends the widely divergent rays forward, without collimation. Light rays exiting collector cone 41 at an angle greater than an f/4 acceptance cone, approximately 7 degrees, are lost and do not contribute to exposure.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

Thus, what is provided is an improved apparatus and method for printing onto a photosensitive medium using LED light sources.

Parts List

10. Optics assembly
12. Uniformizing optics
14. Spatial light modulator
16. Polarizing beamsplitter
18. Focusing optics
20. Light source
21. Anode lead
22. Light source
23. Cathode lead
24. Reflector cup
25. LED chip
26. Light source
27. Bond wire
28. Epoxy dome lens
29. Substrate
30. Electrode
31. LED mount plate
32. Discrete LED
33. LED divergence angle
34. Optics acceptance cone angle
35. Waste light portion
36. Collimating lens
38. Lenslet array (collimator)
40. Patterned electrode
41. Collector cone
43. Electrical leads
45. Uniformizing optics
46. Large area LED
47. Uniformizing optics
48. Heatsink
49. Uniformizing optics
50. Aperture plate
51. Thermo-electric cooler
52. Polarizer
53. Polarizer
55. Polarizer
56. Heatsink
57. Polarizer
60. Red LED array
61. Green and blue LED array
62. Dichroic mirror
63. Analyzer
64. Angled mounting surface
65. Parabolic reflector
66. Single color writer module
70. Telecentric condenser lens
71. Telecentric condenser lens
72. Telecentric condenser lens
73. Folding mirror
75. Folding mirror
77. Folding mirror
80. Polarizing beamsplitter
81. Polarizing beamsplitter
82. Polarizing beamsplitter
84. Polarizing beamsplitter
86. X-cube combiner
90. Spatial light modulator
91. Spatial light modulator (SLM)
95. Spatial light modulator
97. Spatial light modulator
100. Printer apparatus
101. Cone segments
110. Print lens assembly
128. Clear plastic lens
130. LED array
131. Substrate
134. Patterned electrode LED
140. Photosensitive medium
160. Photosensitive medium
141. Multicone structure
202. Film supply
204. Exposure section
208. Film storage unit
210. Control logic processor
212. Media handling subsystem

What is claimed is:

1. In a printing apparatus for recording images onto photosensitive medium, an improved light source for directing, along an illumination axis, light having a first, second, or third wavelength, the light source comprising:
    (a) an array of LEDs hexagonally arranged for minimum, substantially equal spacing between each LED and each of its immediate neighbor LEDs, any one of said LEDs having either a first or a second or a third wavelength, the hexagonally arranged LEDs comprising rows of LEDs with LEDs of adjacent rows being mutually partially positioned within recesses formed between adjacent LEDs in a respective row;
    (b) a logic controller for enabling LEDs within said array according to said first, second, or third wavelength;
    (c) collector optics for collecting emitted light from said at least one first wavelength LED and directing said emitted light from said at least one first wavelength LED along the illumination axis; and
    wherein said collector optics comprise a collimating element and a light guide employing total internal reflection for conditioning light emitted from said at least one first wavelength LED.

2. In a printing apparatus for recording images onto a photosensitive medium, an improved light source for directing, along an illumination axis, light having a first, second, or third wavelength, the apparatus comprising:
    (a) at least one first wavelength LED, positioned on a support element;
    (b) collector optics for collecting emitted light from said at least one first wavelength LED and directing said emitted light from said at least one first wavelength LED along the illumination axis;
    wherein said collector optics comprise a collimating element and a light guide employing total internal reflection for conditioning light emitted from said at least one first wavelength LED;
    (c) at least one second wavelength LED, spaced apart from said at least one first wavelength LED, positioned on said support element and arranged to direct light along the illumination axis; and (d) at least one third wavelength LED, spaced apart from said at least one first wavelength LED, positioned on said support element and arranged to direct light along the illumination axis.

3. An improved light source according to claim 2 wherein said at least one first wavelength LED is green.

4. An improved light source according to claim 2 wherein said support element is generally concave with respect to said illumination axis, such that said at least one second and said at least one third wavelength LEDs are angularly inclined towards said illumination axis.

5. An improved light source according to claim 2 wherein said collector optics comprise a curved reflector for directing said light from said at least one first wavelength LED.

6. An improved light source according to claim 5 wherein said curved reflector is substantially parabolic.

7. A printing apparatus for recording images onto photosensitive medium, comprising:
  (a) at least one first wavelength LED, mounted on a first support element;
  (b) first collector optics for collecting emitted light from said at least one first wavelength LED and directing said emitted light from said at least one first wavelength LED through a dichroic combiner and along an illumination axis, wherein said first collector optics comprises a light guide having an integral collimating element and employing total internal reflection for directing said emitted light toward said dichroic combiner;
  (c) at least one second wavelength LED mounted on a second support element;
  (d) second collector optics for collecting emitted light from said at least one second wavelength LED and directing said emitted light from said at least one second wavelength LED toward said dichroic combiner and along said illumination axis; and
  (e) a spatial light modulator for modulating light received along said illumination axis and for directing the light modulated thereby towards a lens for focusing onto the photosensitive medium.

8. A method for recording images onto photosensitive medium, comprising:
  (a) emitting light from at least one first wavelength LED, positioned on a first support element;
  (b) collecting emitted light from said at least one first wavelength LED through first collector optics and directing said emitted light from said at least one first wavelength LED through a dichroic combiner and along an illumination axis, wherein the step of directing said emitted light comprises the step of collimating emitted light and using total internal reflection;
  (c) emitting light from at least one second wavelength LED positioned on a second support element;
  (d) collecting emitted light from said at least one second wavelength LED through second collector optics and directing said emitted light from said at least one second wavelength LED toward said dichroic combiner and along said illumination axis, wherein the step of directing said emitted light comprises the step of collimating emitted light and using total internal reflection; and
  (e) modulating light from said illumination axis at a spatial light modulator and directing the light modulated thereby towards a lens for focusing onto the photosensitive medium.

* * * * *